United States Patent [19]
Hoebener et al.

[11] Patent Number: 4,919,970
[45] Date of Patent: Apr. 24, 1990

[54] SOLDER DEPOSITION CONTROL

[75] Inventors: Karl G. Hoebener, Georgetown; John J. Stankus, Austin, both of Tex.

[73] Assignee: International Business Machines Corporation, Armonk, N.Y.

[21] Appl. No.: 907,265

[22] Filed: Sep. 15, 1986

[51] Int. Cl.$^5$ ............................................. B05D 5/12
[52] U.S. Cl. ........................................ 427/96; 427/97; 118/213; 118/254; 118/263; 118/264; 118/266
[58] Field of Search .................... 427/96, 97; 118/213, 118/254, 263, 264, 266

[56] References Cited

U.S. PATENT DOCUMENTS

| | | | |
|---|---|---|---|
| 3,226,255 | 12/1965 | Cieniewicz | 118/213 |
| 3,735,730 | 5/1973 | Mitter | 118/205 |
| 4,020,206 | 4/1977 | Beil | 427/97 |
| 4,023,487 | 5/1977 | Mitter | 118/261 |
| 4,024,629 | 5/1977 | Lemoine | 427/97 |
| 4,127,337 | 11/1978 | Bishop | 118/264 |
| 4,323,593 | 4/1982 | Tsunashima | 427/97 |
| 4,459,320 | 7/1984 | Fefferman | 427/97 |
| 4,515,304 | 5/1985 | Berger | 228/180.1 |
| 4,529,477 | 7/1985 | Lundberg | 427/97 |
| 4,604,966 | 8/1986 | Kohn | 118/213 |
| 4,761,881 | 8/1988 | Bora et al. | |

FOREIGN PATENT DOCUMENTS 3040314 5/1982 Fed. Rep. of Germany ........ 427/97

OTHER PUBLICATIONS

Simo Karttunen and Pirkko Oittinen, "The Basic Principles of Printing as a Surface Coating Process" in Science and Technology of Surface Coating, ed. B. N. Chapman and J. C. Anderson, Academic Press, 1974, pp. 222–237.

Primary Examiner—Shrive Beck
Assistant Examiner—Vi D. Dang
Attorney, Agent, or Firm—Andrea P. Bryant

[57] ABSTRACT

A technique for one step solder application through a mask to a printed circuit board (PCB) having pads for surface mountable components and through holes for a leaded components is disclosed wherein the amount of solder deposited on the pads and in the holes is simultaneously, independently controlled as a function of mask thickness, blade hardness and blade to mask angle.

7 Claims, 2 Drawing Sheets

SOLDER DEPOSITION CONTROL

TECHNICAL FIELD

This invention relates to attaching electronic components of varying types, for example, leaded through hole and surface mountable components, to printed circuit boards. More particularly, it relates to controllably depositing solder paste in a single step to both plated through holes (PTH) and surface mount pads in a substrate.

BACKGROUND ART

The prior art teaches a variety of methods for applying solder to printed circuitry substrates as well as various ways to control the amount of solder deposited at any given location on the substrate. Conventionally, solder paste is deposited through a mask or screen, that is, a metal stencil with apertures arranged in a pattern corresponding to the desired solder locations on the substrate. Normally, the thickness of solder deposited is controlled as a function of the mask thickness, where the thicker the mask the more solder paste is deposited.

U.S. Pat. No. 3,735,730 to Mitter discloses apparatus for applying a flowable medium to a carrier. The apparatus is provided with a spreading element for applying the flowable medium evenly at all points and the pressure of which upon the exposed surface and the density of the applied flowable medium can be varied continuously during the operation of the apparatus.

When it is desired to mount both leaded through hole and surface mount components to a single printed circuit board, adjustments must be made in conventional prior art techniques for applying solder. The amount of solder paste deposited at each component site is critical, and the amount required in the through holes varies from that required at a surface mount land. The conventional method for attaching both pin in hole and surface mount components uses two solder applications. The solder paste is first applied to the surface mount sites by screen printing, then reflowed. This step is followed by a second step using wave soldering to apply solder to the pin in hole components.

Another prior art method for attaching leaded through hole and surface mount components to a single printed circuit board is taught in U.S. Pat. No. 4,515,304 to Berger wherein the leaded through hole components are first placed on the printed circuit board. The lead ends are crimped to hold them in place while solder paste is applied, using individual applicator nozzles, to the lead ends and to solder pads for the surface mount components. Steps of inserting, crimping, turning the board and then applying solder are required. Then Surface mount components may then be placed on the second side of the printed circuit board and the whole reflow soldered.

DISCLOSURE OF THE INVENTION

The present invention provides for a single step solder application method for both surface mount and leaded through hole components with fewer steps than those required by the prior art to obtain on the same side of a printed circuit board the attachment of both leaded and leadless electronic components. The invention provides for independent control of solder deposition amount into PTHs and onto surface mount lands in one solder application step through a single mask.

Mask thickness is the primary control for the amount of solder paste deposited for surface mount components while PTH solder amounts are controlled as a function of the hardness of and application angle of the resilient squeegee used to push the solder paste through the mask onto and into the PCB.

It has been found that varying the hardness of the squeegee blade material and a length dimension of the blade attachment mechanism, which alters the attack angle, allows control of the amount of solder applied into the PTHs. The amount of solder applied on the surface mount pads is substantially constant even while the amount applied in the PTHs can be varied.

BRIEF DESCRIPTION OF THE DRAWING

The various objects and advantages of the invention will be more clearly understood through the following description taken in connection with the accompanying drawing wherein like reference numerals are used throughout to designate the same parts and wherein.

BEST MODE FOR CARRYING OUT THE INVENTION

Figure 1:
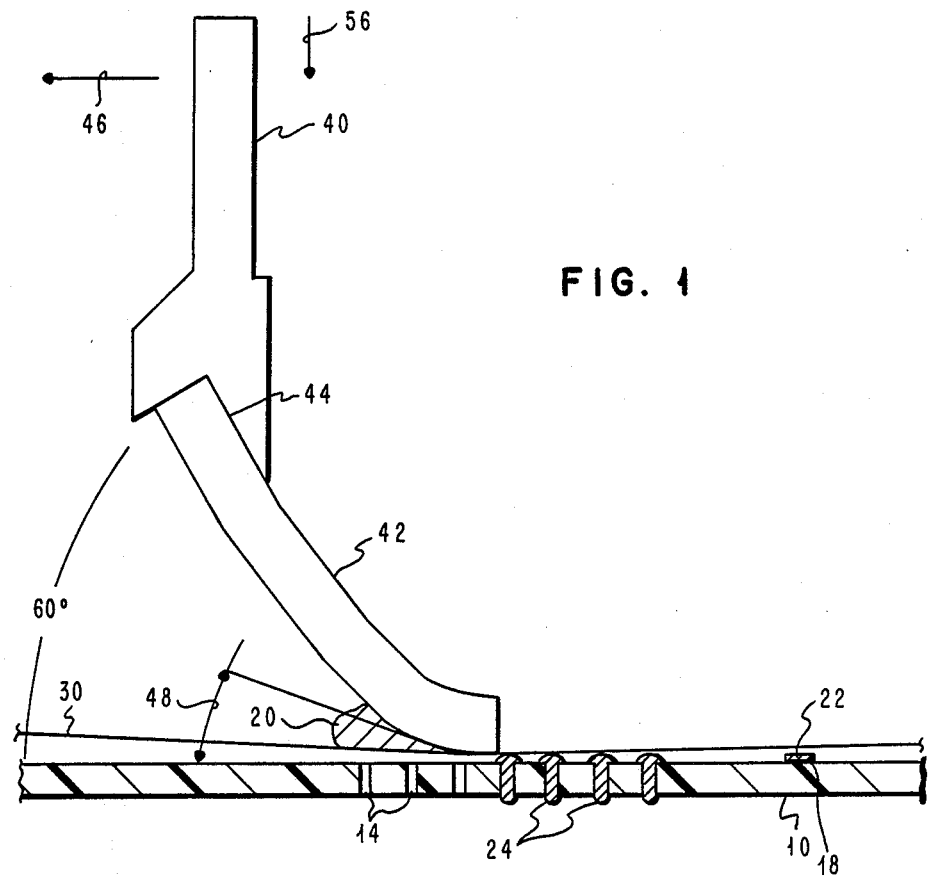
FIG. 1 is a schematic cross-sectional view of a printed circuit board (PCB) and apparatus for applying solder.

In FIG. 1 PCB 10 is shown during a solder application process step. PCB 10 is provided with a plurality of plated through holes 14 in a pattern corresponding to the leads of a particular component type. In addition, it is provided with pads 18 for surface mount components. Solder 20 is applied through mask 30 which has apertures (not shown) corresponding to the locations of surface mount pads 18 and PTHs 14. Mask 30 is preferably made of a metallic alloy such as beryllium copper having a thickness in a range of about 10 to 12 mils. The screen printing mechanism includes squeegee apparatus shown schematically as including a holder 40 and resilient squeegee blade 42.

A length dimension of the holder element 40 where blade 42 is attached is critical to the invention as it is the variance of this portion of holder 40 which provides for the variance in the attack angle for applying solder paste 20. The length of holder 40, section 44 to which blade 42 is attached is the critical dimension. As illustrated in FIG. 1, the short holder causes blade 42 to make an angle 48 with the surface of mask 30. Solder paste 20 rolls along in this space.

As squeegee blade 42 passes in the direction of arrow 46, solder paste 20 is pushed through mask 30 so that solder "bumps" 22, one of which is shown, are applied to surface mount lands 18 and solder "mushrooms" 24 are applied in the PTHs 14. A normal force component in the direction of arrow 56 is applied to holder 40 during its lateral travel.

Figure 2:
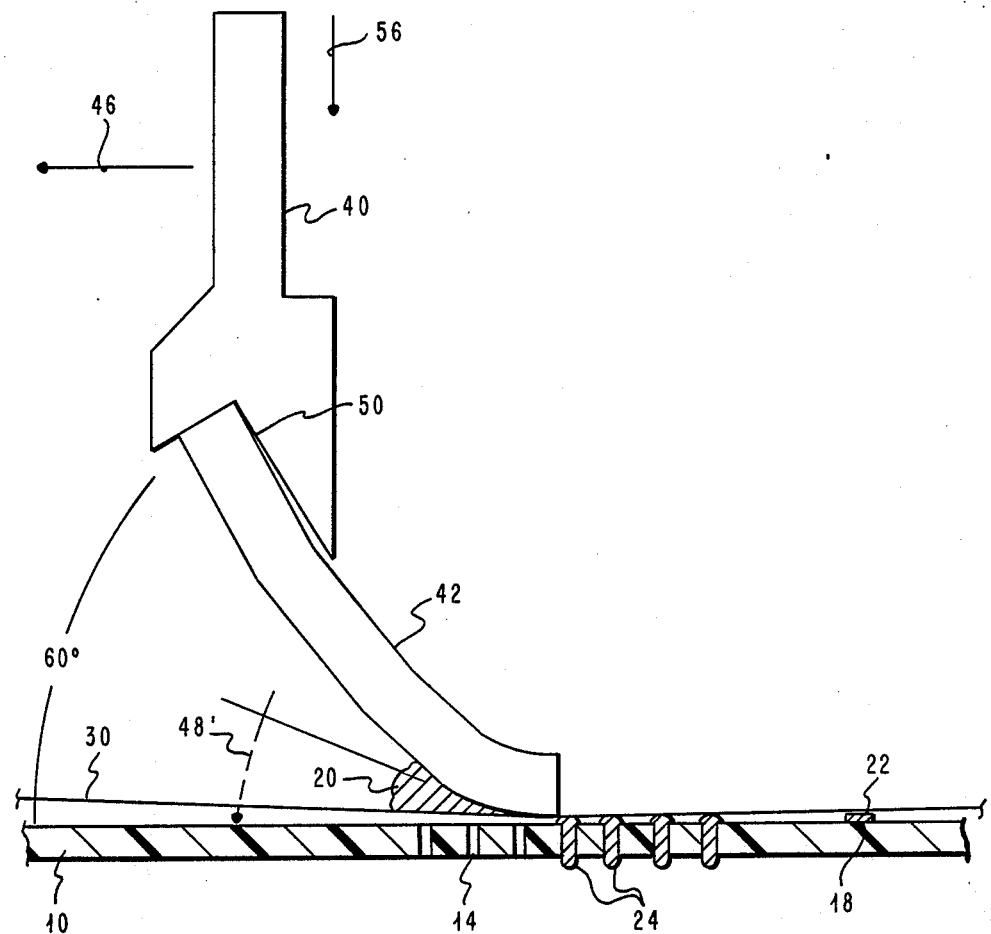
FIG. 2 is similar to FIG. 1 but the dimensions of the squeegee holder have been changed.

FIG. 2 is like FIG. 1 except that a length dimension of a section 50, corresponding to section 44 in FIG. 1, of holder 40 is changed so that the angle 48', made by squeegee 42 with the mask 30 is changed. As shown in FIG. 2, the long holder makes a larger angle 48' between blade 42 and the surface of mask 30.

Figure 3:
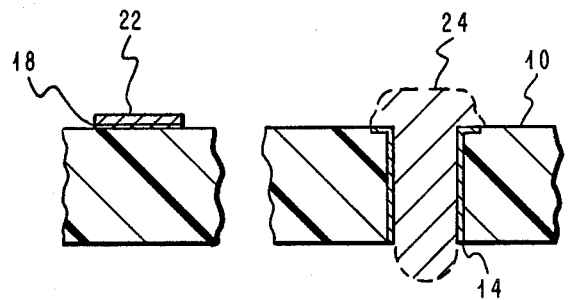
FIG. 3 shows an enlarged cross-section of PCB 10 after solder is applied.

FIG. 3 shows in enlarged detail solder 22 deposited on a surface mount land 18 and solder 24 deposited in a PTH 14.

In normal usage solder paste 20 is distributed across and through mask 30 by squeegee blade 42. Various semi-rigid plastics such as vinyl, polyethylene or silicone rubber are among the materials suitable for squeegee blade 42. The hardness of the squeegee blade 42 is one variable for the control of the amount of solder 24 deposited in PTHs 14. It has been found that a hardness in the range of about 60 to 80 durometers is preferable.

Note the difference between squeegee holder 40 section 44 in FIG. 1 and section 50 in FIG. 2. Holder sections 44 and 50 will hereafter be referred to as the short and long holder respectively.

Making these changes in squeegee blade 42 hardness and angle allows more or less paste or solder as required to be deposited in holes 14 without any substantial change in the amount of paste or solder deposited on surface pads 18. Table 1 illustrates the results an experiment comparing the effects of varying the hardness of the squeegee blade 42 and holder 40 section length.

TABLE I

Solder Paste Applied and Resultant Reflowed Solder

|  | Long Holder 75 Durometer | Short Holder 70 Durometer |
| --- | --- | --- |
| Paste in Hole | 5.5 Milligrams | 7.8 Milligrams |
| Solder in Hole | 4.7 Milligrams | 7.0 Milligrams |
| Paste on Surface Pad | 2.8 Milligrams | 2.7 Milligrams |
| Solder on Surface Pad | 2.4 Milligrams | 2.5 Milligrams |

Squeegee pressure exerted in the direction of arrow 56 in FIG. 1, may be adjusted between 8-12 lbs. for optimum solder deposition on surface pads 18. It has been found that increasing squeegee pressure does not increase solder volume in PTHs 14. That solder volume has been found to be controlled by the attack angle 48 and 48', FIGS. 1 and 2, respectively. Changing the attack angle controls the solder deposition into PTHs 14. The squeegee angle is a function of the hardness of the squeegee blade 42 and a length dimension (44, FIG. 1; 50 FIG. 2) of the squeegee holder 40. The amount of solder 20 applied to surface mount pads 18 can be maintained constant by the constant thickness mask.

A method is described wherein the amount of solder paste deposited into and onto a PCB is independently controlled, simultaneously on surface mount pads and into the PTHs. That is, the paste amount in the PTHs may be varied to accommodate various lead diameters and printed circuit substrate thickness and thereby provide adequate solder at reflow. The variation in PTH solder paste amount is carried out while solder paste amount deposited on the surface mount pads is held constant. The amount of solder paste deposited on the surface mount pads is controlled primarily by the thickness of the stencil mask 30. This is accomplished through the relative forward motion of a squeegee blade 42 in its holder 40 having a variable length dimension (44 in FIG. 1 and 50 in FIG. 2) which creates a variably controllable relative angle between the squeegee blade and the PCB.

While the invention has been shown and described having reference to a specific preferred embodiment those skilled in the art will understand that variations in form and detail may be made without departing form the spirit and scope of the invention.

What is claimed is:

1. A single step process for depositing solder through a mask, using a resilient blade, onto pads for surface mountable components and into plated through holes for leaded components said pads and plated through holes being provided on and in a printed circuit substrate, comprising the steps of:

controlling the amount of solder deposited on the surface mount lands as a function of mask thickness; and simultaneously and independently controlling the amount of solder deposited into the plated through holes as a function of the hardness of the blade and an angle between the blade and mask surface.

2. The process of claim 1 wherein the hardness of the blade is between 60 and 80 durometer.

3. The process of claims 1 or 2 wherein the attack angle between the resilient blade and mask is varied by changing a length dimension of the blade holder.

4. The process of claims 1, 2 or 3 wherein the attack angle may be varied in a range from about 15 degrees to about 45 degrees.

5. Apparatus for applying various amounts of solder through a mask to various sites on and in a printed circuit substrate fixedly held in contact therewith, in one pass comprising:

a resilient blade adapted for contacting the mask at a predetermined angle;

means for varying the angle of contact of the blade to the mask; and means for causing relative motion between the blade and the mask, whereby the amount of solder deposited at sites on the surface of the substrate is a function of mask thickness and the amount of solder deposited into holes at sites in the substrate is a function of the hardness and attack angle of the blade.

6. A process for depositing solder through a mask using a resilient blade in a holder adapted for relative motion with the mask, said blade having a hardness between 60 and 80 durometers, said solder being deposited both onto and into a printed circuit substrate having pads for surface mountable components and plated through holes for leaded components, comprising the steps of:

controlling the amount solder deposited on pads as a function of mask thickness; and.

simultaneously controlling the amount of solder deposited into the plated through holes as a function of the hardness of the blade and an angle between the blade and mask.

7. The process of claim 6 additionally including the step of:

varying the angle between the resilient blade and mask by changing a length dimension of the blade holder.

* * * * *